US007642636B2

(12) United States Patent
Park et al.

(10) Patent No.: US 7,642,636 B2
(45) Date of Patent: Jan. 5, 2010

(54) STACK PACKAGE OF BALL GRID ARRAY TYPE

(75) Inventors: Sang-Wook Park, Seongnam-si (KR); Hyung-Gil Baek, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 57 days.

(21) Appl. No.: 11/580,080

(22) Filed: Oct. 13, 2006

(65) Prior Publication Data

US 2007/0138618 A1 Jun. 21, 2007

(30) Foreign Application Priority Data

Oct. 13, 2005 (KR) .................... 10-2005-0096659

(51) Int. Cl.
*H01L 23/02* (2006.01)

(52) U.S. Cl. .................. 257/686; 257/738; 257/777; 257/780; 257/784; 257/787; 257/E21.503; 257/23.069; 257/E23.085; 257/E25.013

(58) Field of Classification Search ............... 257/686, 257/738, 777, 780, 784, 787, E21.503, 23.069, 257/E23.085, E25.013
See application file for complete search history.

(56) References Cited

U.S. PATENT DOCUMENTS

| 6,686,656 | B1 * | 2/2004 | Koh et al. ................ 257/686 |
| 6,762,078 | B2 * | 7/2004 | Shin et al. ............... 438/123 |
| 6,818,474 | B2 * | 11/2004 | Kim et al. ............... 438/108 |
| 6,982,488 | B2 * | 1/2006 | Shin et al. ............... 257/777 |
| 7,045,892 | B2 * | 5/2006 | Kyung .................... 257/723 |
| 7,061,120 | B2 * | 6/2006 | Shin et al. ............... 257/777 |
| 2005/0023657 | A1 | 2/2005 | Tsai et al. |
| 2005/0046006 | A1 * | 3/2005 | Yeom .................... 257/686 |
| 2005/0104182 | A1 * | 5/2005 | Kim ...................... 257/686 |
| 2005/0199992 | A1 * | 9/2005 | Baek et al. .............. 257/686 |
| 2007/0029660 | A1 * | 2/2007 | Baek ..................... 257/686 |

FOREIGN PATENT DOCUMENTS

| KR | 1020000056804 A | 9/2000 |
| KR | 1020010027266 | 4/2001 |
| KR | 1020050003892 | 1/2005 |
| KR | 1020050020373 | 3/2005 |
| KR | 1020050020373 A | 3/2005 |
| KR | 1020050023538 | 3/2005 |
| KR | 1020050023538 A | 3/2005 |

OTHER PUBLICATIONS

Office Action from the Korean Intellectual Property Office dated Dec. 24, 2007 for a corresponding Korean patent application.

* cited by examiner

*Primary Examiner*—Andy Huynh
(74) *Attorney, Agent, or Firm*—Harness Dickey & Pierce, P.L.C.

(57) ABSTRACT

A stack package may include a plurality of individual packages arranged in a stack. Each individual package may have a circuit substrate disposed on the upper and lower surfaces of a semiconductor chip. Through bonding wires, a lower circuit substrate may be electrically connected to the semiconductor chip, and an upper circuit substrate may be electrically connected to the lower circuit substrate. An upper package in the stack may be mechanically and electrically connected to the upper circuit substrate of a lower package in the stack through conductive bumps. The semiconductor chip may be surrounded by the upper and the lower circuit substrates, and molding resins. The individual packages may have the same conductive bump layout.

19 Claims, 6 Drawing Sheets

STACK PACKAGE OF BALL GRID ARRAY TYPE

PRIORITY STATEMENT

This U.S. non-provisional application claims benefit of priority under 35 U.S.C. §119 from Korean Patent Application No. 2005-96659, filed on Oct. 13, 2005, the entire contents of which are incorporated herein by reference.

BACKGROUND

1. Field of the Invention

Example embodiments of the present invention relate to a semiconductor package technology, and more particularly to a stack package of a ball grid array type.

2. Description of the Related Art

Stacking technology may be implemented as a method to improve the degree of integrity in a package assembly process. Stacking technology may be classified into chip stacking methods and/or package stacking methods. Package stacking methods may, as the name implies, involve stacking packages. The chips of the packages may be inspected for electrical characteristics and/or may be verified for reliability in a package state (e.g., before assembling the packages in the stack). Accordingly, package stacking methods may provide advantages in reliability and/or yield compared to chip stacking methods.

FIG. 1 is a schematic sectional view of a conventional stack package 10. The stack package 10 may include a stack of individual packages of a ball grid array ("BGA") type. A package stacking method may be implemented to assemble the stack package 10. As shown in FIG. 1, the conventional BGA stack package 10 may be fabricated by stacking an upper package 11b on a lower package 11a through conductive bumps 12. The conductive bumps 12 may be disposed at the edge portion of the lower package 11b.

Although the conventional stack package 10 is generally thought to provide acceptable performance, it is not without shortcomings. FIG. 2 shows types of defects that may occur in the conventional stack package 10.

For example, the individual packages 11a and 11b may become warped due to the configuration of the individual packages themselves. Such warpage may causes defects in a stacking process and/or low reliability, for example. Each individual package 11a and 11b may have a circuit substrate 14 that may be attached to a surface of a semiconductor chip 13. Thus, the upper and the lower surfaces of each individual package may be dissimilar in configuration and/or material. As a result, warpage may occur due to differences in the coefficients of thermal expansion during various heat-accompanied processes (for example). The warpage phenomena of the individual packages 11a and 11b may cause a defect 21 in which a conductive bump 12 becomes separated from an adjacent package, and/or solder joint cracks 22, for example.

The conventional stack package 10 may have a configuration by which a rear surface of the semiconductor chip 13 may be exposed outwards. Accordingly, the semiconductor chip 13 may experience breakage defects 23 induced by external shock.

A BGA package may have a standard conductive bump layout. However, when the same kinds of packages are stacked according to the conventional technology, the lowermost package 11a may not have the standard conductive bump layout. If the lowermost package 11a has a different conductive bump layout, a yield of the stacking process may decrease.

SUMMARY

According to an example, non-limiting embodiment, a package may include a first package, and a second package may be stacked on the first package. Each of the first package and the second packages may include a semiconductor chip having an active surface and a non-active surface opposite to the active surface. A first circuit substrate may be mounted on the active surface of the semiconductor chip. A second circuit substrate may be mounted on the non-active surface of the semiconductor chip. First internal connection means may be provided for electrically connecting together the semiconductor chip and the first circuit substrate. Second internal connection means may be provided for electrically connecting together the first circuit substrate and the second circuit substrate. External contact means may be provided on the first circuit substrate. The external contact means provided on the first circuit substrate of the second package may be provided for contacting the second circuit substrate of the first package.

According to another example, non-limiting embodiment, a package may include a first package. The first package may include a first semiconductor chip having an active surface and a back surface opposite to the active surface. A first lower circuit substrate may be mounted on the active surface of the first semiconductor chip. A first upper circuit substrate may be mounted on the back surface of the first semiconductor chip. Conductive bumps may be provided on the first lower circuit substrate. A second package may be stacked on the first package. The second package may include a second semiconductor chip having an active surface and a back surface opposite to the active surface. A second lower circuit substrate may be mounted on the active surface of the second semiconductor chip. A second upper circuit substrate may be mounted on the back surface of the second semiconductor chip. Conductive bumps may be provided on the second lower circuit substrate. The conductive bumps provided on the second lower circuit substrate of the second package may contact the first upper circuit substrate of the first package.

According to another example, non-limiting embodiment, a method may involve providing a first package. The first package may include a first semiconductor chip having an active surface and a back surface opposite to the active surface. A first lower circuit substrate may be mounted on the active surface of the first semiconductor chip. A first upper circuit substrate may be mounted on the back surface of the first semiconductor chip. Conductive bumps may be provided on the first lower circuit substrate. A second package may be provided. The second package may include a second semiconductor chip having an active surface and a back surface opposite to the active surface. A second lower circuit substrate may be mounted on the active surface of the second semiconductor chip. A second upper circuit substrate may be mounted on the back surface of the second semiconductor chip. Conductive bumps may be provided on the second lower circuit substrate. The second package may be stacked on the first package so that the conductive bumps provided on the second lower circuit substrate of the second package may contact the first upper circuit substrate of the first package.

The drawings are provided for illustrative purposes only and are not drawn to scale. The spatial relationships and relative sizing of the elements illustrated in the various embodiments may be reduced, expanded and/or rearranged to improve the clarity of the figure with respect to the corresponding description. The figures, therefore, should not be interpreted as accurately reflecting the relative sizing or positioning of the corresponding structural elements that could be encompassed by an actual device manufactured according to example embodiments of the invention.

DETAILED DESCRIPTION OF EXAMPLE, NON-LIMITING EMBODIMENTS OF THE INVENTION

Example, non-limiting embodiments of the present invention will be described with reference to the accompanying drawings. This invention may, however, be embodied in many different forms and should not be construed as limited to example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

Well-known structures and processes are not described or illustrated in detail to avoid obscuring the present invention.

An element is considered as being mounted (or provided) "on" another element when mounted or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

Figure 1:
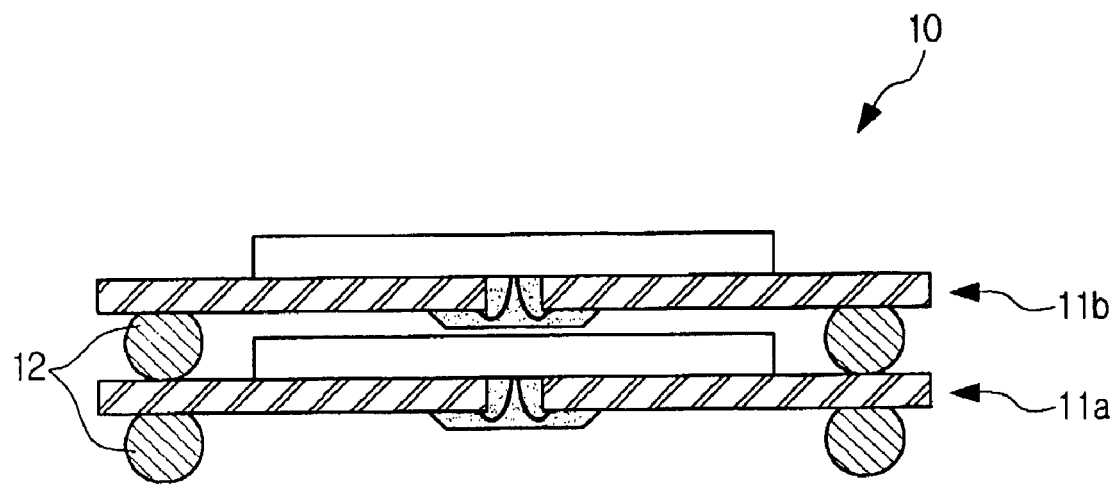
FIG. 1 is a schematic sectional view of a conventional stack package.
Figure 2:
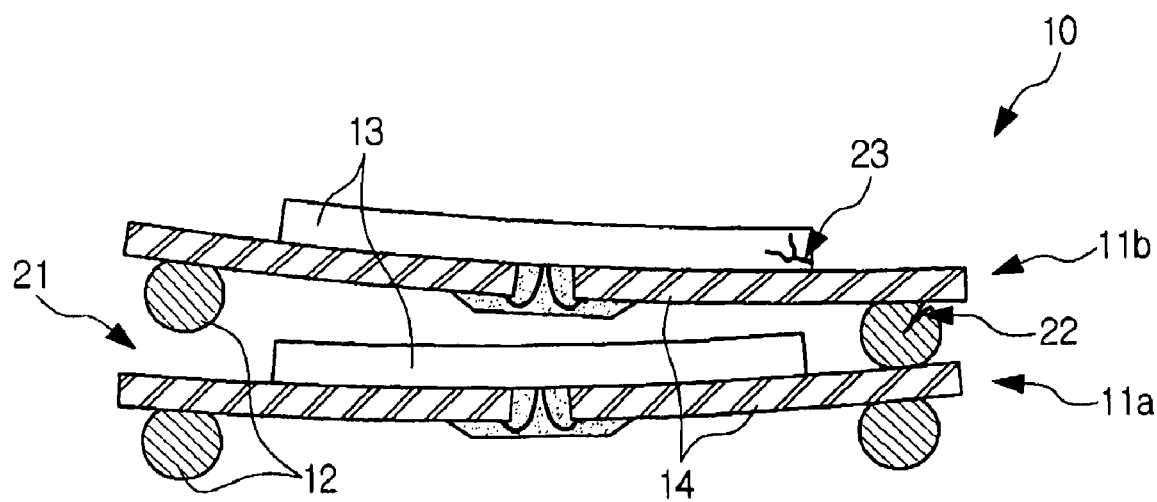
FIG. 2 is a sectional view illustrating types of defects that may occur in the conventional stack package of FIG. 1.
Figure 3:
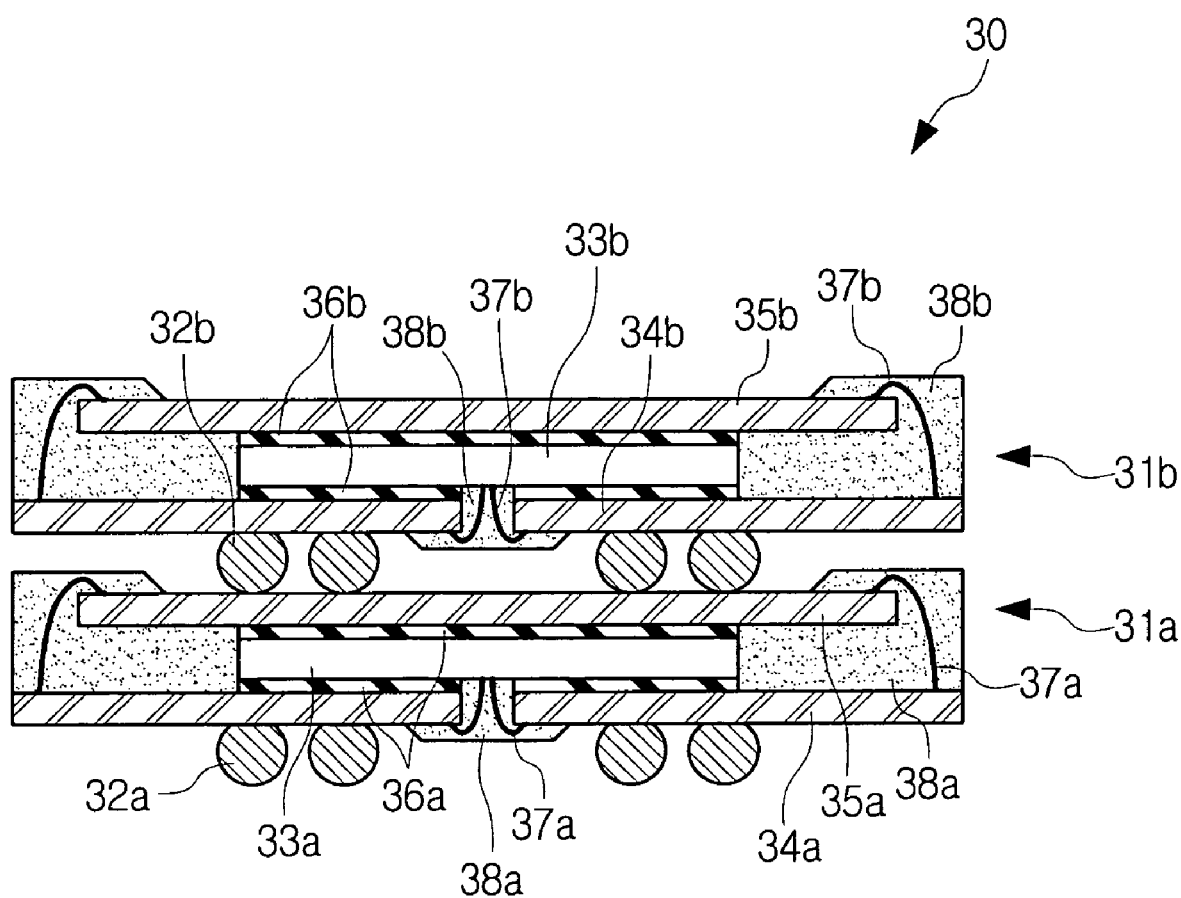
FIG. 3 is a sectional view of a stack package of a BGA type according to an example, non-limiting embodiment of the present invention.

FIG. 3 is a sectional view of a stack package 30 according to an example, non-limiting embodiment of the present invention.

Referring to FIG. 3, the stack package 30 may include a first individual package 31a (or "lower package") and a second individual package 31b (or "upper package") that may be stacked on the lower package 31 a. In this example embodiment, the stack package 30 may include two individual packages 31a, 31b. In alternative embodiments, the stack package may include more than two individual packages. For example, additional individual packages may be stacked on the upper package 31b.

The lower package 31 a may have the same configuration as the upper package 31b. Each individual package 31a, 31b may includes a semiconductor chip 33a, 33b that may have an active surface and a non-active surface opposite to the active surface. A first circuit substrate 34a, 34b (or "lower circuit substrate") may be disposed on the active surface of the semiconductor chip 33a, 33b. A second circuit substrate 35a, 35b (or "upper circuit substrate") may be disposed on the non-active surface. The semiconductor chips 33a, 33b and circuit substrates 34a, 34b and 35a, 35b may be mechanically connected together through adhesive layers 36a, 36b interposed therebetween. By way of example only, the semiconductor chips 33a, 33b may be memory chips, and the upper and the lower circuit substrates 34a, 34b and 35a, 35b may be printed circuit boards. Also, the adhesive layers 36a, 36b may be adhesives that harden after application in a liquid phase, and/or adhesives in the form of a tape. Numerous and varied semiconductor chips, circuit substrates and adhesive, which are well known in this art, may be suitably implemented.

The circuit substrates 34a, 34b and 35a, 35b may be disposed on the upper and the lower surfaces of the semiconductor chips 33a, 33b, and therefore the upper and the lower sides of each individual package 31a, 31b may be similar in configuration and material. In this way, the individual packages may experience a reduced warpage phenomena that may be attributable to the difference in coefficients of thermal expansion between the materials of the individual packages.

Each individual package 31a, 31b may include internal connection means 37a, 37b and external contact means 32a, 32b. The internal connection means 37a, 37b may include first internal connection means for electrically connecting together the semiconductor chip 33a, 33b and the lower circuit substrate 34a, 34b, and second internal connection means for electrically connecting together the upper and the lower circuit substrates 34a, 34b and 35a, 35b. The external contact means 32a, 32b may be provided on the lower circuit substrate 34a, 34b. The external contact means 32a of the lower package 31a may provide a mechanical and electrical connection between the stack package 30 and an external device, such as an external substrate (not shown), for example. The external contact means 32b of the upper package 31b may mechanically and electrically connect to the upper circuit substrate 35a of the lower package 31a.

By way of example only, the internal connection means 37a, 37b may be bonding wires, and the external contact means 32a, 32b may be conductive bumps, such as solder balls. In alternative embodiments, numerous and varied conductive elements may be suitably implemented.

The active surface of the semiconductor chip 33a, 33b may support a plurality of chip pads (not shown). The chip pads may be located on a central region of the active surface. In alternative embodiments, the chip pads may be located on other regions of the active surface. The lower circuit substrate 34a, 34b may have a window through which the chip pads may be exposed, and a plurality of first bonding pads 41 (see FIG. 4) may be provided on the surface facing away from the chip 33a, 33b. The bonding wire 37a, 37b (or first internal connection means) may electrically connect together the chip pad and the first bonding pad through the window provided in the lower circuit substrate 34a, 34b. The bonding wires 37a, 37b may be covered with molding resins 38a, 38b.

Figure 4:
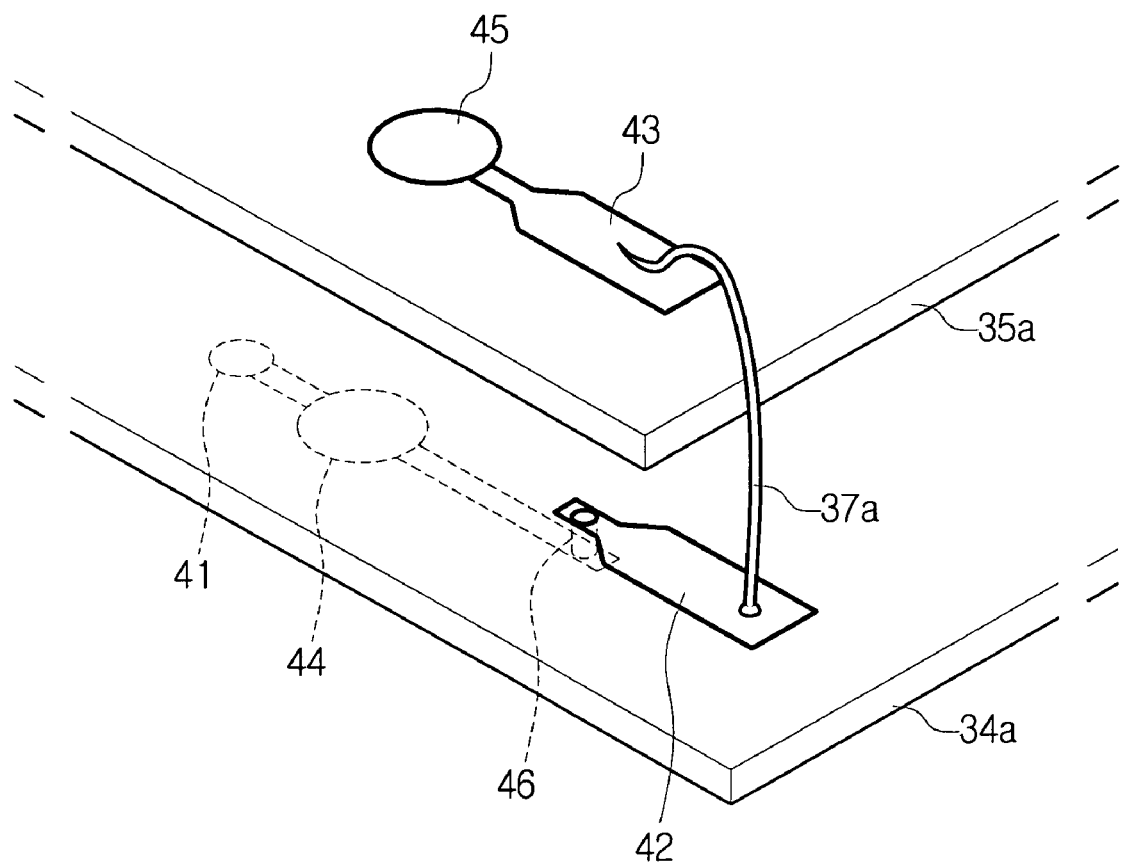
FIG. 4 is a partial perspective view of a method that may be implemented for connecting upper and lower circuit substrates in a single package used in a stack package according to an example, non-limiting embodiment of the present invention.

FIG. 4 is a partial perspective view of a method that may be implemented for connecting the lower and the upper circuit substrates 34a and 35a of the lower package 31a according to an example, non-limiting embodiment of the present invention. A similar connecting method may be implemented for the upper package 31b, and therefore a detailed discussion of the same is omitted.

Referring to FIG. 4, the first bonding pad 41 may be provided on the surface of the lower circuit substrate 34a that may face away from the chip. A second bonding pad 42 may be provided on the surface of the lower circuit substrate 34a that may face the chip. In addition, a third bonding pad 43 may be provided on the surface of the upper circuit substrate 35a that may face away from the chip. The first bonding pad 41 may be electrically connected to the chip pad of the semiconductor chip through a bonding wire (or first internal connection means). As shown in FIGS. 3 and 4, the second bonding pad 42 and the third bonding pad 43 may be electrically connected to each other through another bonding wire 37a (or second internal connection means). The lower circuit substrate 34a may be larger than the upper circuit substrate 35a. As shown in FIG. 3, the bonding wire 37a electrically connecting together the second and the third bonding pads 42 and 43 may be covered with a molding resin 38a.

The lower and the upper circuit substrates 34a and 35a may include bump lands 44 and 45, respectively. For example, a first bump land 44 may be provided on the surface of the lower circuit substrate 34a that may face away from the chip, and a second bump land 45 may be provided on the surface of the upper circuit substrate 35a that may face away from the chip. The lower circuit substrate 34a may include a via 46 that may electrically connect together the second bonding pad 42 and the first bump land 44. The first bump land 44 may support the conductive bump 32a of the lower package 31a, and the second bump land 45 may contact the conductive bump 32b of the upper package 31b.

The conductive bumps 32a, 32b of the lower package 31a and upper package 31b may have the same bump layout. Although a chip select pin and/or clock enable pin may be connected to each individual package 31a, 31b separately, all of the individual packages within the stack may be configured to have the same standard bump layout. This may be achieve via the internal circuit designs of the circuit substrate 34a, 34b, as is well-known by those skilled in the art.

The stack package 30 may be fabricated by a method, which is schematically illustrated in FIGS. 5A through 5E.

Figure 5A:
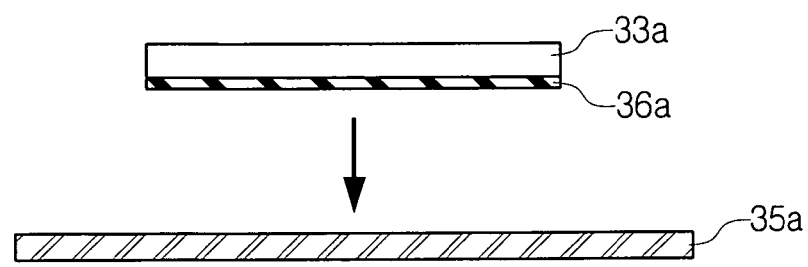
FIGS. 5A through 5E are sectional views of a method that may be implemented to manufacture a stack package according to an example, non-limiting embodiment of the present invention.

As shown in FIG. 5A, the semiconductor chip 33a may be mounted on the upper circuit substrate 35a via an adhesive layer 36a. The adhesive layer 36a may be applied to the upper circuit substrate 35a and/or the non-active surface of the semiconductor chip 33a. The adhesive layer 36 may be an adhesive and/or an adhesive tape.

Figure 5B:
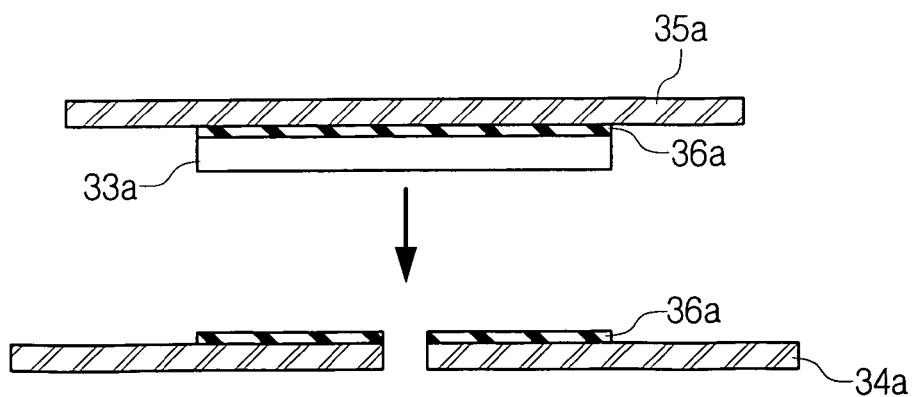

As shown in FIG. 5B, the semiconductor chip 33a may be attached to a lower circuit substrate 34a via an adhesive layer 36a. The adhesive layer 36a may be applied to the lower circuit substrate 34a and/or the active surface of the semiconductor chip 33a. The adhesive layer 36 may be an adhesive and/or an adhesive tape.

Figure 5C:
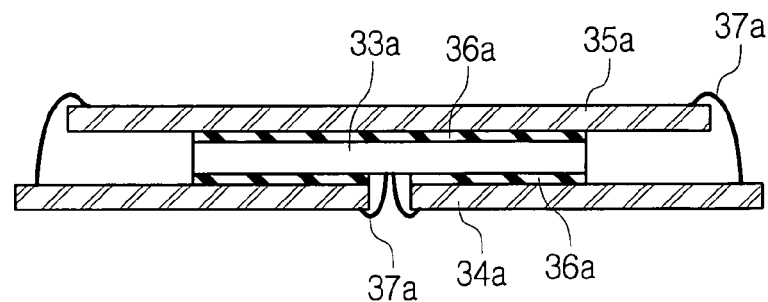

Wire bonding procedures may be performed as shown in FIG. 5C. Bonding wires 37a may electrically connect together the semiconductor chip 33a and the lower circuit substrate 34a. Bonding wires 37a may also electrically connect together the lower and the upper circuit substrates 34a, 35a. The wire bonding may be performed using a general wire bonding technique and/or a bump reverse bonding technique, all of which are well known in this art.

Figure 5D:
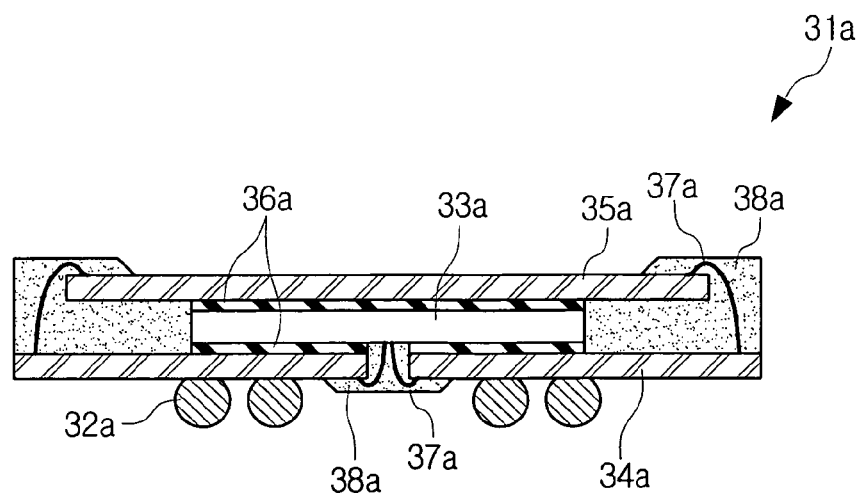

As shown in FIG. 5D, a molding and conductive bump formation processes may be performed. The molding process may involve covering the bonding wires 37a with a molding resin 38a. The molding resin 38a may be of an epoxy type. The conductive bump formation process may involve forming the conductive bump 32a on a bump land of the lower circuit substrate 34a.

Figure 5E:
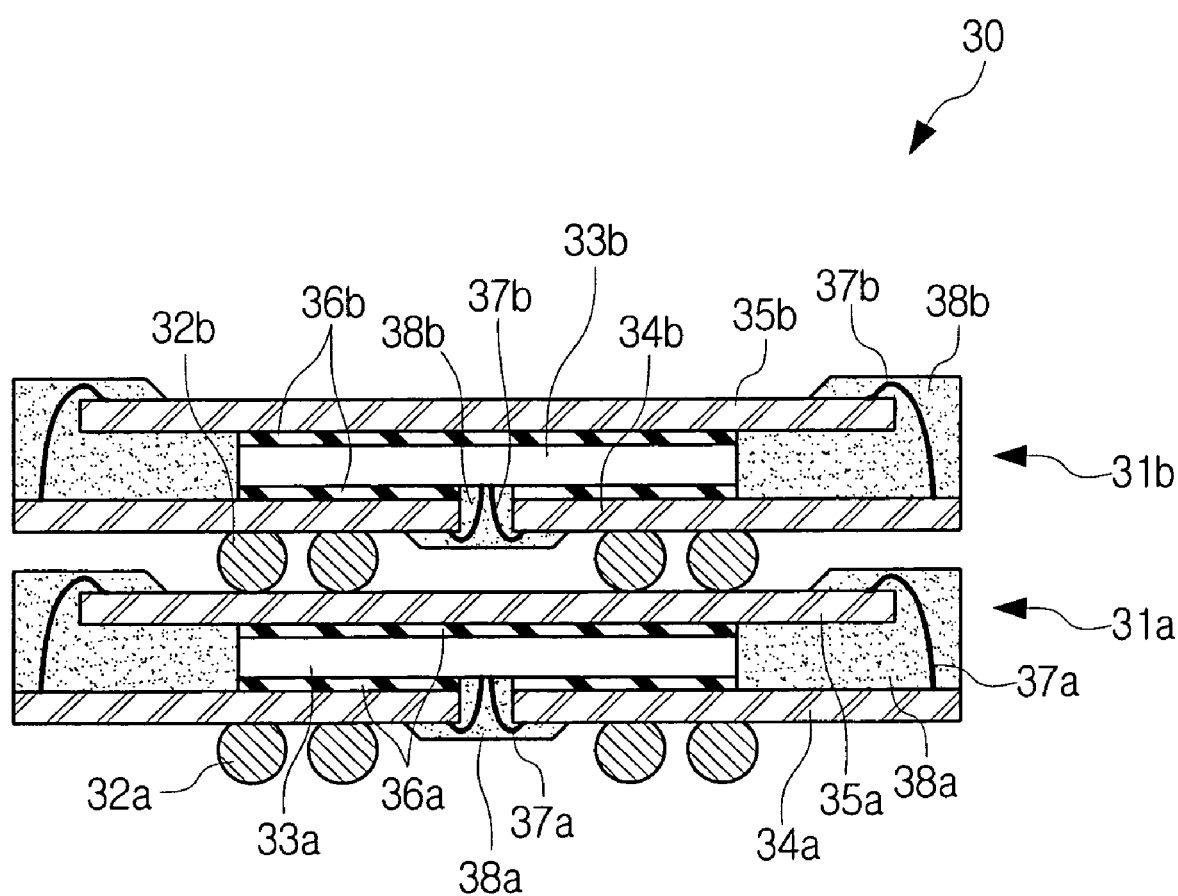

Numerous individual packages may be fabricated as described above. As shown in FIG. 5E, a stack package 30 may be fabricated by stacking an upper package 31b on a lower package 31a. Mechanical and electrical connections between the lower and the upper packages 31a, 31b may be achieved by attaching the conductive bumps 32b of the upper package 31b to the upper circuit substrate 35a of the lower package 31a.

Example, non-limiting embodiments of the present invention have been described. It will be understood that many variations and/or modifications of the basic inventive concepts, which may appear to those skilled in the art, will fall within the spirit and scope of the present invention as defined by the appended claims.

What is claimed is:

1. A package comprising:
a first package; and
a second package stacked on the first package;
each of the first package and the second package including
a semiconductor chip having an active surface and a non-active surface opposite to the active surface,
a first circuit substrate mounted on the active surface of the semiconductor chip,
a second circuit substrate mounted on the non-active surface of the semiconductor chip,
a first internal connection electrically connecting together the semiconductor chip and the first circuit substrate,
a second internal connection electrically connecting together the first circuit substrate and the second circuit substrate, and
an external contact provided on the first circuit substrate;
the external contact provided on the first circuit substrate of the second package for contacting the second circuit substrate of the first package, wherein the first and second circuit substrates are larger than the semiconductor chip.

2. The package of claim 1, wherein a plurality of chip pads are provided on the active surface of the semiconductor chip.

3. The package of claim 2, wherein the first internal connection is a plurality of first bonding wires.

4. The package of claim 3, wherein a plurality of first bonding pads are provided on a surface of the first circuit substrate that faces away from the semiconductor chip, and
wherein the first bonding wires connect the chip pads to the first bonding pads.

5. The package of claim 4, wherein the chip pads are provided on a center portion of the active surface.

6. The package of claim 5, wherein the first circuit substrate comprises a window through which the chip pads are exposed.

7. The package of claim 6, further comprising a first molding resin covering the first bonding wire.

8. The package of claim 1, wherein the second internal connection is a plurality of second bonding wires.

9. The package of claim 8, wherein a plurality of second bonding pads are provided on a surface of the first circuit substrate that faces the chip,
a plurality of third bonding pads are provided on the surface of the second circuit substrate that faces away from the semiconductor chip, and
the second bonding wires connect the second bonding pads to the third bonding pads.

10. The package of claim 9, wherein the first circuit substrate is larger than the second circuit substrate.

11. The package of claim 9, further comprising a second molding resin covering the second bonding wire.

12. The package of claim 1, wherein the external contact is a plurality of conductive bumps.

13. The package of claim 12, wherein the conductive bumps of the first package and the second package have the same bump layout.

14. The package of claim 12, wherein a plurality of first bump lands are provide on a surface of the first circuit substrate that faces away from the semiconductor chip, and wherein the conductive bumps are provided on the first bump lands.

15. The package of claim 14, wherein a plurality of second bump lands are provided on a surface of the second circuit substrate that faces away from the semiconductor chip, and wherein the conductive bumps of the second package contact the second bump lands of the first package.

16. The package of claim 1, further comprising a first adhesive layer interposed between the active surface of the semiconductor chip and a surface of the first circuit substrate that faces the semiconductor chip.

17. The package of claim 1, further comprising a second adhesive layer interposed between the non-active surface of the semiconductor chip and the surface of the second circuit substrate that faces the semiconductor chip.

18. The package of claim 1, further comprising:

a plurality of second bonding pads on a surface of the first circuit substrate that faces the chip;

a plurality of third bonding pads on a surface of the second circuit substrate that faces away from the semiconductor chip, wherein the second substrate is attached directly to the non-active surface of the semiconductor chip via an adhesive and the second internal connection connects the plurality of second bonding pads to the plurality of third bonding pads.

19. A package comprising:

a first package; and a second package stacked on the first package;

each of the first package and the second package including a semiconductor chip having an active surface and a non-active surface opposite to the active surface, a first circuit substrate mounted on the active surface of the semiconductor chip, wherein a plurality of second bonding pads are provided on a surface of the first circuit substrate that faces the chip, a second circuit substrate mounted on the non-active surface of the semiconductor chip, wherein a plurality of third bonding pads are provided on a surface of the second circuit substrate that faces away from the semiconductor chip, first internal connection electrically connecting together the semiconductor chip and the first circuit substrate, second internal connection electrically connecting together the plurality of second bonding pads to the second circuit substrate, and an external contact provided on the first circuit substrate, the external contact provided on the first circuit substrate of the second package for contacting the second circuit substrate of the first package, wherein the second circuit substrate is attached directly to the non-active surface of the semiconductor chip via an adhesive and the second internal connection connects the plurality of second bonding pads to the plurality of third bonding pads.

* * * * *